(12) United States Patent
Tam et al.

(10) Patent No.: US 9,178,093 B2
(45) Date of Patent: Nov. 3, 2015

(54) SOLAR CELL MODULE ON MOLDED LEAD-FRAME AND METHOD OF MANUFACTURE

(75) Inventors: Samuel Waising Tam, Daly City, CA (US); Tai Wai Pun, Hong Kong (CN); Tak Shing Pang, Hong Kong (CN)

(73) Assignee: Flextronics AP, LLC, San Jose, CA (US)

( * ) Notice: Subject to any disclaimer, the term of this patent is extended or adjusted under 35 U.S.C. 154(b) by 625 days.

(21) Appl. No.: 13/540,840

(22) Filed: Jul. 3, 2012

(65) Prior Publication Data

US 2013/0032203 A1 Feb. 7, 2013

Related U.S. Application Data

(60) Provisional application No. 61/504,802, filed on Jul. 6, 2011.

(51) Int. Cl.
| H01L 31/00 | (2006.01) |
| H01L 31/048 | (2014.01) |
| H01L 31/02 | (2006.01) |

(52) U.S. Cl.
CPC ........ *H01L 31/048* (2013.01); *H01L 31/02013* (2013.01); *Y02E 10/50* (2013.01)

(58) Field of Classification Search
CPC ........................ H01L 31/048; H01L 31/02013
USPC .................................................. 136/259, 256
See application file for complete search history.

(56) References Cited

U.S. PATENT DOCUMENTS

| 5,199,990 | A | 4/1993 | Zeniya |
| 5,904,504 | A | 5/1999 | Allen |
| 6,020,555 | A | 2/2000 | Garboushian et al. |
| 6,395,972 | B1 | 5/2002 | Tran et al. |
| 6,574,858 | B1 | 6/2003 | Hembree |
| 6,646,330 | B2 * | 11/2003 | Kubara et al. ................. 257/677 |
| 7,684,689 | B2 | 3/2010 | Shangguan et al. |
| 7,796,187 | B2 | 9/2010 | Shangguan et al. |
| 7,842,542 | B2 | 11/2010 | Shim et al. |
| 7,872,686 | B2 | 1/2011 | Kale et al. |
| 7,977,777 | B2 | 7/2011 | Federici et al. |
| 8,026,440 | B1 | 9/2011 | Gordon |
| 8,092,102 | B2 | 1/2012 | Shangguan et al. |
| 8,153,886 | B1 | 4/2012 | Garboushian et al. |
| 2002/0153038 | A1 | 10/2002 | Umemoto et al. |

(Continued)

FOREIGN PATENT DOCUMENTS

| WO | WO 2009/106305 | 9/2009 |
| WO | WO 2010042981 A1 * | 4/2010 |

OTHER PUBLICATIONS

International Preliminary Report on Patentability for International (PCT) Patent Application No. PCT/US12/45487 mailed Jan. 16, 2014, 6 pages.

(Continued)

*Primary Examiner* — Allison Bourke
(74) *Attorney, Agent, or Firm* — Sheridan Ross P.C.

(57) ABSTRACT

A solar cell having a molded lead frame, and method of manufacture of same, is disclosed. Specifically, a plurality of solar cells is manufactured from a strip of lead-frames and soft solder techniques for die assembly and component assembly. After wire bonding, glass attachment and transfer molding, a trim and form process produces individual solar cells having a molded lead frame.

10 Claims, 6 Drawing Sheets

(56) References Cited

U.S. PATENT DOCUMENTS

| | | |
|---|---|---|
| 2004/0007324 A1 | 1/2004 | Henn et al. |
| 2007/0204900 A1 | 9/2007 | Lai et al. |
| 2008/0083450 A1* | 4/2008 | Benoit et al. ............ 136/246 |
| 2008/0110491 A1 | 5/2008 | Buller et al. |
| 2008/0170141 A1 | 7/2008 | Tam et al. |
| 2008/0190480 A1* | 8/2008 | Joshi ...................... 136/246 |
| 2009/0120500 A1* | 5/2009 | Prather et al. ............ 136/259 |
| 2009/0140406 A1 | 6/2009 | Horne et al. |
| 2009/0159122 A1* | 6/2009 | Shook et al. ............. 136/256 |
| 2009/0159128 A1* | 6/2009 | Shook et al. ............. 136/259 |
| 2009/0255471 A1 | 10/2009 | Morad |
| 2009/0298218 A1 | 12/2009 | Federici et al. |
| 2009/0309095 A1 | 12/2009 | Buechel et al. |
| 2010/0326492 A1 | 12/2010 | Tan et al. |
| 2011/0037886 A1 | 2/2011 | Singh et al. |
| 2011/0089519 A1 | 4/2011 | Chen et al. |
| 2011/0121441 A1 | 5/2011 | Halstead et al. |
| 2011/0146778 A1 | 6/2011 | Croft et al. |
| 2011/0194023 A1 | 8/2011 | Tam et al. |
| 2011/0265871 A1 | 11/2011 | Lamarche |
| 2011/0299848 A1 | 12/2011 | Shangguan et al. |
| 2012/0231585 A1* | 9/2012 | Louh ........................ 438/122 |
| 2012/0235308 A1* | 9/2012 | Takahashi ................. 257/777 |

OTHER PUBLICATIONS

International Search Report and Written Opinion for International (PCT) Patent Application No. PCT/US12/45487 mailed Sep. 25, 2012, 7 pages.

Official Action with English Summary for Mexico Patent Application No. MX/a/2014/000183, dated Apr. 17, 2015 5 pages.

* cited by examiner

SOLAR CELL MODULE ON MOLDED LEAD-FRAME AND METHOD OF MANUFACTURE

CROSS REFERENCE TO RELATED APPLICATION

The present application claims the benefits of U.S. Provisional Application Ser. No. 61/504,802, filed Jul. 6, 2011, entitled "SOLAR CELL MODULE ON MOLDED LEAD-FRAME AND METHOD OF MANUFACTURE", which is incorporated herein by this reference in its entirety.

FIELD OF THE DISCLOSURE

The present disclosure is generally directed toward a solar cell module and specifically directed toward a solar cell module on molded lead frame and method of manufacturing solar cell module on molded lead frame.

BACKGROUND

Interest in alternative energy sources that are sustainable and renewable continues to increase as costs of conventional energy sources continues to rise. This interest has generated development of alternative energy sources such as solar power. Solar power requires photovoltaic devices. Photovoltaic devices configured as semiconductor photovoltaic are commonly termed solar cells. Solar cells must be robust in order to enable a reliable energy source, and must be manufactured efficiently to satisfy volume and cost requirements.

Solar cells are typically made with ceramic substrates using injection molding techniques and require heating steps to enable bonding or adhesion of components. Conventionally designed and manufactured solar cells tend to generate relatively high manufacturing costs and low utilization. Also, conventional solar cells are manufactured in individual units, rather than through a strip format, which increases production cost. Furthermore, conventional approaches require heating to enable bonding, and encounter quality problems such as inconsistent control of the void area between a die and a thermal pad.

Attempts to improve solar cell reliability and loser manufacturing costs include stacking of laminates to form a package that supports a solar cell, as described in US 2011/0265871, the entire contents of which are hereby incorporated herein by reference. The stacked configuration provides layers that serve variously as a heat sink, solar cell mount and electrical connection. However, the '871 publication appears difficult to manufacture in a cost-effective manner.

U.S. Pat. No. 8,026,440 provides a solar cell module unit with a laminar substrate fitted with an electrically conductive upper layer, a middle layer which is heat conductive but not electrically conductive, and a thermally conductive bottom layer. A solar cell is mounted on a printed circuit board positioned on the upper layer. The '440 publication does not use a lead frame substrate and is silent as to its method of manufacture. The entire contents of U.S. Pat. No. 8,026,440 are hereby incorporated herein by reference.

U.S. Pat. No. 7,977,777 provides a lead frame thermoplastic package for a solar cell. The '777 publication does not use strip format construction techniques and uses stamp and plating techniques to attach its die to its lead frame. The entire contents of U.S. Pat. No. 7,977,777 are hereby incorporated herein by reference.

What is needed, therefore, is a solar cell module that is of increased capability, increased quality and decreased cost than conventional solar cells and methods of manufacture. What is needed is a design for such a solar cell and for a method of manufacture.

SUMMARY

It is, therefore, one aspect of the present disclosure to provide a solar cell module on molded lead frame. It is also an aspect of the present disclosure to provide easy-to-implement and cost-effective methods of constructing a solar cell module on molded lead frame.

The solar cell module of the present disclosure replaces the conventional ceramic substrate with a copper lead-frame and employs soft solder techniques to replace conventional attachment methods for components that require thermal heating and/or curing. The process provides greater control of the void between a thermal pad and die, and uses a strip format production approach rather than an individual unit approach. Also, copper lead-frame provides a higher thermal conductivity than conventional ceramic substrates. Thus, a solar cell module that is of increased capability, increased quality and decreased cost than conventional solar cells is produced.

In one embodiment of the solar cell module device, the solar cell device comprises a substrate having an upper surface and a lower surface, and a semiconductor die positioned on the substrate upper surface. The die has an upper surface and a lower surface. A solder material is disposed between and adheres the upper surface of the substrate and the lower surface of the semiconductor die. A protective layer of material is disposed on the semiconductor die upper surface; the protective layer having an upper surface and a lower surface. An electrical component is mounted to the upper surface of the substrate adjacent to the semiconductor die. One or more electrical connections are made between the upper surface of the substrate and the semiconductor die. Lastly, the solar cell module has a mold structure surrounding the semiconductor die, the mold configured with a recess formed above the top surface of the protective layer.

In one embodiment of a method of manufacturing the solar cell module device, a frame strip is provided which comprises multiple lead frame substrates, the substrates having an upper surface and a lower surface. A solder material is dispensed onto the upper surface of one or more of the substrates and attaches a diode electrical component to the solder material. A solder material is dispensed onto the upper surface of the substrates and attaches a semiconductor die to the solder material. One or more electrical connections are made between the upper surface of the substrates and the semiconductor die. A protective member is attached to an upper surface of the semiconductor die. A mold structure is attached to the upper surface of the substrates, the mold configured to surround the semiconductor die and further configured with a recess formed above the upper surface of the protective layer. The mold structures are then trimmed from the frame strip to form solar cell modular devices.

In another embodiment of a method of manufacturing the solar cell module device, a frame strip is provided, the frame strip comprising multiple lead frame substrates, the substrates having an upper surface and a lower surface. A solder material is dispensed onto the upper surface of the substrates and attaches a diode electrical component to the solder material. A protective member is attached to the upper surface of the semiconductor dies. A solder material is dispensed onto the upper surface of the substrates and attaches the semiconductor die, with attached protective member, to the solder material. One or more electrical connections are then made between the upper surface of the substrates and the semiconductor die. A mold structure is attached to the upper surface of the substrates, the mold configured to surround the semiconductor die and further configured with a recess formed above the upper surface of the protective layer. The mold structures are then trimmed from the frame strip to form solar cell modular devices.

The present disclosure will be further understood from the drawings and the following detailed description. Although this description sets forth specific details, it is understood that certain embodiments of the invention may be practiced without these specific details.

BRIEF DESCRIPTION OF THE DRAWINGS

The accompanying drawings, which are incorporated in and constitute a part of the specification, illustrate embodiments of the disclosure and together with the general description of the disclosure given above and the detailed description of the drawings given below, serve to explain the principles of the disclosures.

It should be understood that the drawings are not necessarily to scale. In certain instances, details that are not necessary for an understanding of the disclosure or that render other details difficult to perceive may have been omitted. It should be understood, of course, that the disclosure is not necessarily limited to the particular embodiments illustrated herein.

Figure 1:
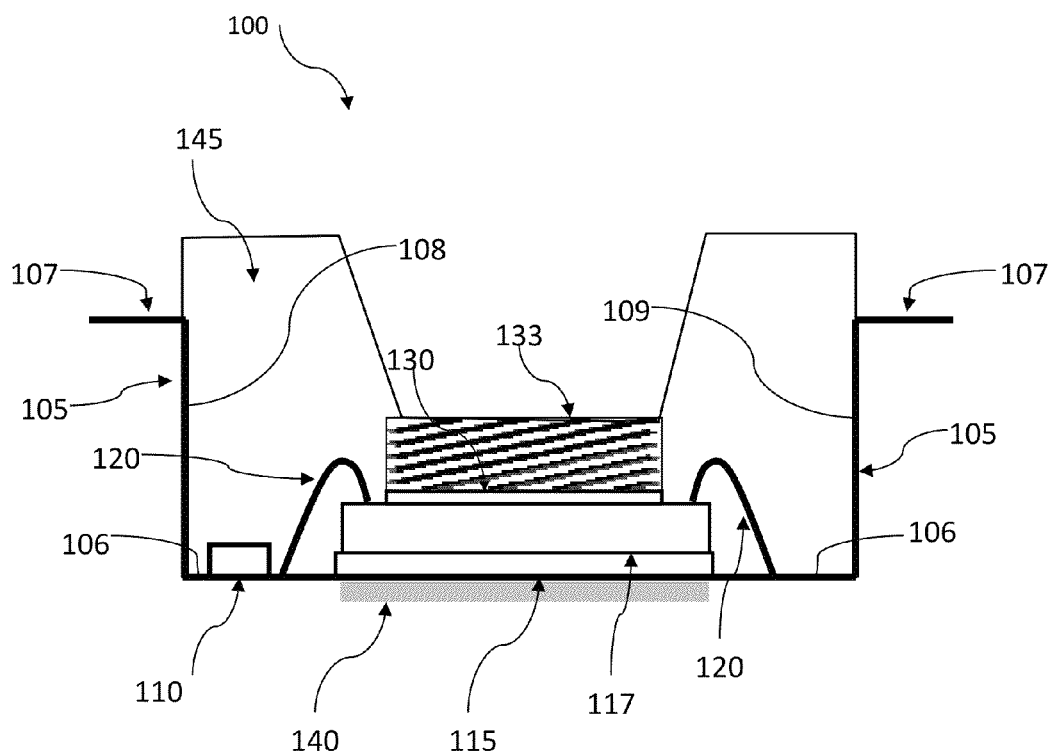
Figure 2A:
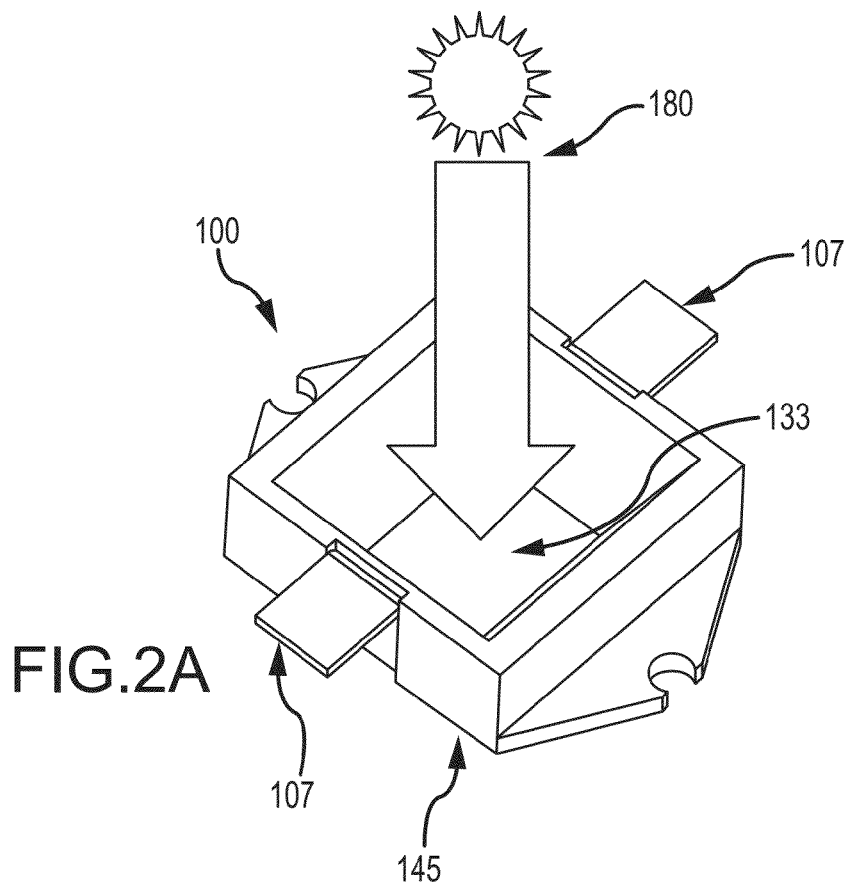
Figure 2B:
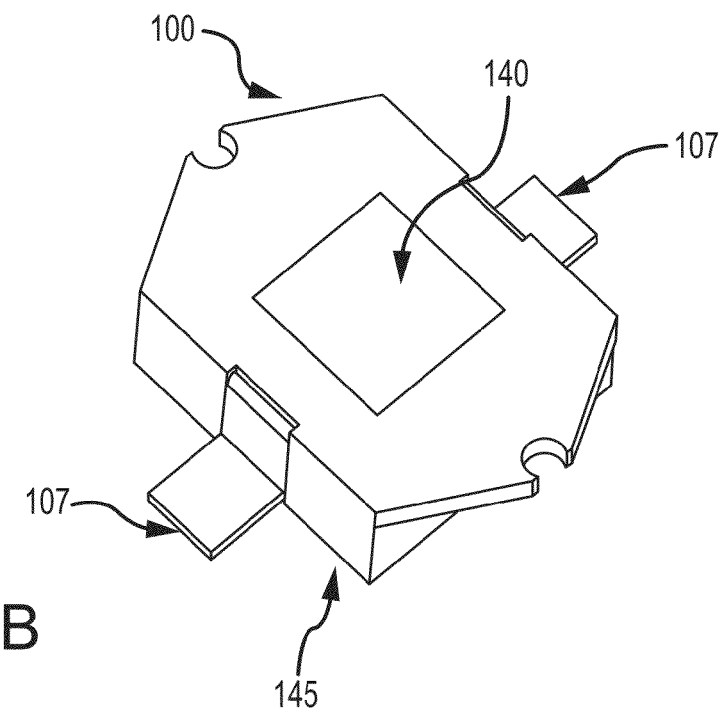
Figure 3:
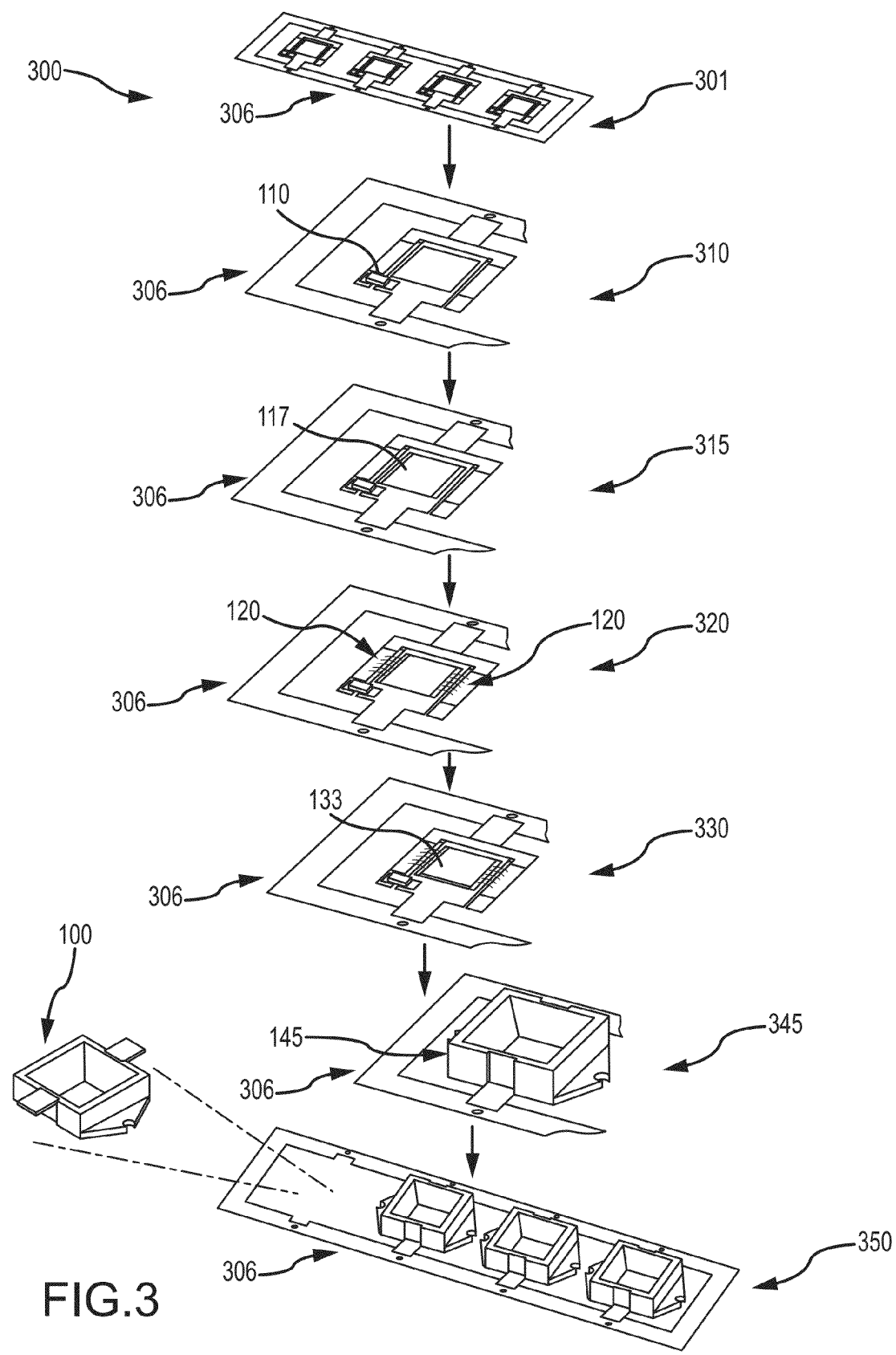
Figure 4A:
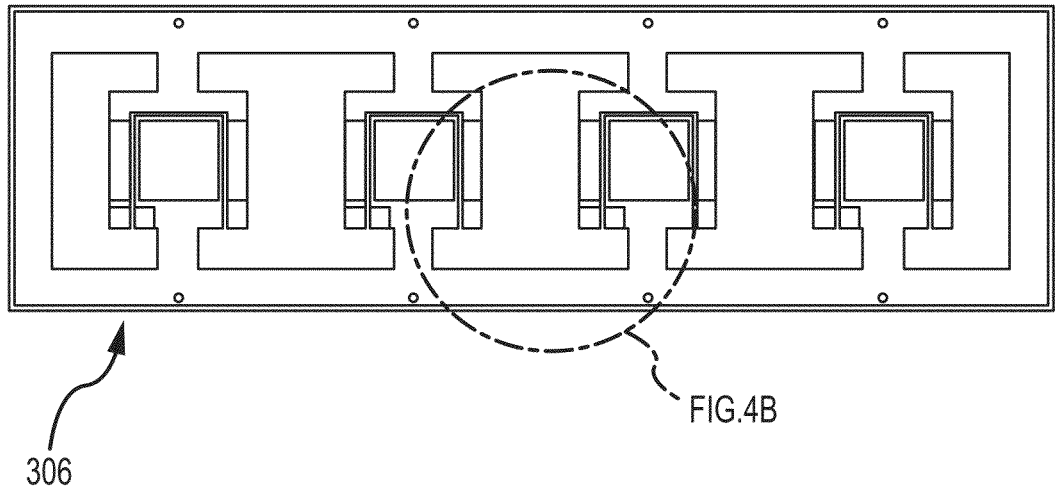
Figure 4B:
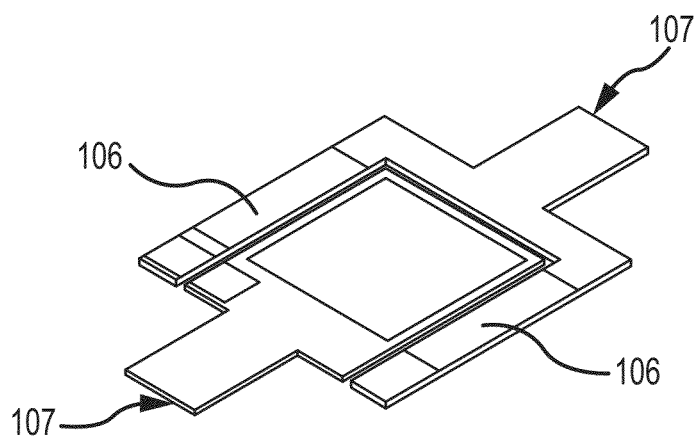
Figure 4C:
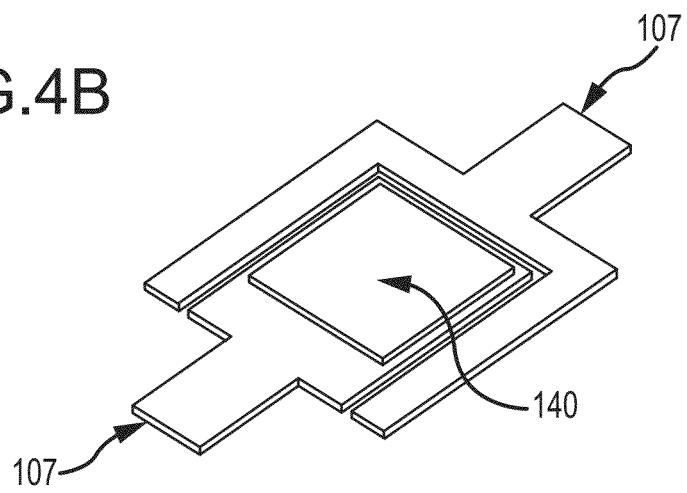
Figure 5:
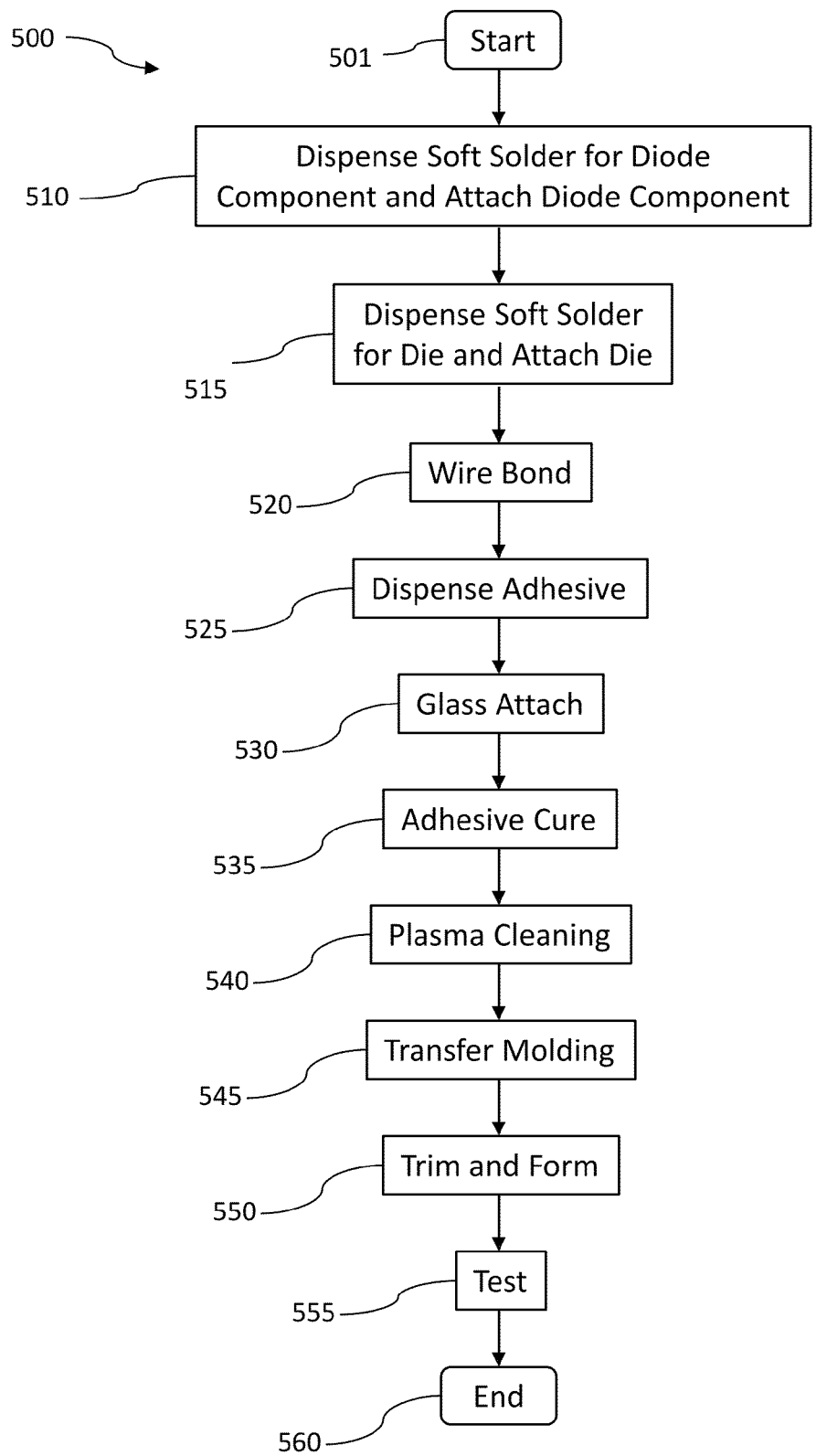
Figure 6:
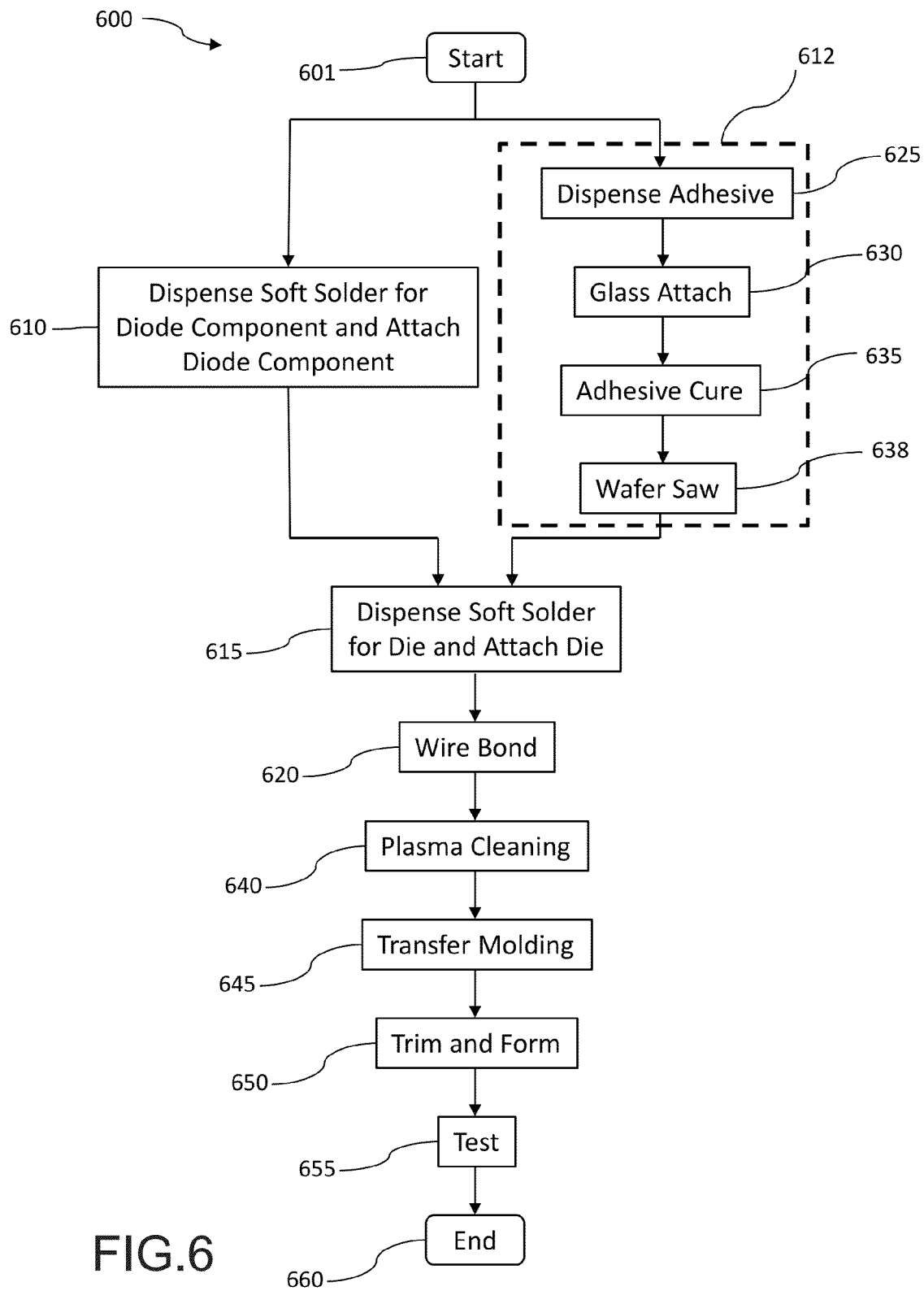

The present disclosure is described in conjunction with the appended figures:

FIG. 1 is a cross-sectional side-view of a solar cell module on molded lead frame in accordance with at least some embodiments of the present disclosure;

FIG. 2A is a perspective top-view of a solar cell module on molded lead frame in accordance with some embodiments of the present disclosure;

FIG. 2B is a perspective bottom-view of a solar cell module on molded lead frame in accordance with some embodiments of the present disclosure;

FIG. 3 is a representation of a method of manufacture of a solar cell module on molded lead frame in accordance with at least some embodiments of the present disclosure;

FIG. 4A is a top-view of a strip of frame elements employed in a method of manufacture of a solar cell module on molded lead frame in accordance with at least some embodiments of the present disclosure;

FIG. 4B is a perspective top-view of a single frame element employed in a method of manufacture of a solar cell module on molded lead frame in accordance with at least some embodiments of the present disclosure;

FIG. 4C is a perspective bottom-view of a single frame element employed in a method of manufacture of a solar cell module on molded lead frame in accordance with at least some embodiments of the present disclosure;

FIG. 5 is a flow diagram of an embodiment of a method of manufacture of a solar cell module on molded lead frame in accordance with at least some embodiments of the present disclosure; and FIG. 6 is a flow diagram of an alternate embodiment of a method of manufacture of a solar cell module on molded lead frame in accordance with at least some embodiments of the present disclosure.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. Preferred embodiments are described to illustrate the present invention, not to limit its scope, which is defined by the claims. Like elements in various embodiments are commonly referred to with like reference numerals. It being understood that various changes may be made in the function and arrangement of elements without departing from the spirit and scope of the appended claims.

Referring now to FIGS. 1-6, representations and configurations of the device and methods of manufacture of the device are shown. Although embodiments of the present disclosure will be described in connection with a solar cell module on molded lead frame, those of skill in the art will appreciate that the features disclosed herein may be applied to create other electrical substrate modules.

In regard to FIG. 1, a cross-sectional side-view of the device 100 is provided. A solar cell module device 100 and components thereof will be described in accordance with at least some embodiments of the present disclosure. It should be appreciated that the term solar cell module device as used herein includes a completed solar cell module device or any intermediate solar cell module device (e.g., one or more partially-assembled components of a solar cell module device).

FIG. 1 depicts a first example of a solar cell module device 100 having a frame 105, component 110, die 117, glass 133, thermal pad 140 and mold 145. Adhesive 130 is positioned between glass 133 and die 117. The frame 105 forms connector pins 107 on each side of solar cell module device 100 and plating areas 106. Frame 105 comprises a first side with an interior surface 108 and a second side with an interior surface 109. The mold 145 engages with the interior surface of the first side of the substrate 108 and the interior surface of the second side of the substrate 109.

Two wires 120 attach, respectively, to each of the plating areas 106 and to the die 117. Soft solder 115 is positioned between the die 117 and the frame 105. Component 110 is positioned on one of the plating areas 106.

FIGS. 2A-B depict a respective perspective top-view and bottom-view of the solar cell module device 100, with connector pins 107, thermal pad 140, and mold 145 identified. Further, FIG. 2A depicts the solar cell module 100 when engaged with sunlight 180 imparted to and through the glass 133 component.

Mold 145 is configured to form a cavity or recess to allow exposure of a least a portion of glass 133. In one embodiment, more than 50% of the glass surface upper surface is exposed. In one embodiment, the cavity or recess is inclined, that is, the cavity or recess is not perpendicular to the upper surface of the frame 105. In one embodiment, the cavity or recess is inclined at an angle at least 5 degrees from vertical or at least 5 degrees from perpendicular to the upper surface of the frame 105.

Frame 105 can be constructed of a lead-frame, and more specifically a copper lead frame. Other materials known to one skilled in the art for similar frame use may be used. For example, frame 105 may comprise an alloy comprising at least one member selected from the group consisting of nickel, copper, iron, silver and tin. U.S. Pat. No. 6,646,330 discloses a lead frame for use in a electronics and a process for producing same. For the purpose of providing additional disclosure regarding frame 105 and other components of device 105 and associated processes, the entire contents of U.S. Pat. No. 6,646,330 are hereby incorporated herein by reference.

Wire 120 can be constructed of gold wire, although other materials known to one skilled in the art to similarly connect dies 117 and plating areas 106 may be used, for example nickel. Component 110 can be a diode, but could be any surface-mount technology (SMT) component known to one skilled in the art. Glass 133 may comprise glass, although other materials known to one skilled in the art for protecting dies 117 and capable of adhesion may be used, to include various plastics, polymers, and other optically inactive materials. Die 117 may be a semiconductor die. Adhesive 130 may be any adhesive known to one skilled in the art, to include UV glue. Soft solder 115 may be any soft solder composition or application technique involving soft solder known to one skilled in the art. Mold 145 may be of a plastic composition, although other materials known to one skilled in the art for molds may be used, to include materials such as polyethylene terephthalate (PET), polyethylene terephthalate glycol (PET G), crystalline PET (PET-C).

The components of FIG. 1, in particular the stack of components glass 133, adhesive 130, die 117, soft solder 115, frame 105 and/or thermal pad 140 are positioned substantially co-planar with respect to one another. The phrase "substantially co-planar" can be understood to mean sharing a common plane within a tolerance not exceeding 5 degrees and/or 2 mil.

Adhesive 130 may span substantially all of the width and/or length dimension of the glass 133. Also, soft solder 115 may span substantially all of the width and/or height of the die 117. Further, thermal pad 140 may span substantially all of the width and/or length dimension of the die 117. The phrase "span substantially all of the length" can be understood to mean to span no less than 50 percent of the compared length, i.e. the cross-sectional width dimension of adhesive 130 is no less than 50 percent of the dimension of the cross-sectional width dimension of glass 133 as depicted in FIG. 1. Similarly, the cross-sectional width dimension of soft solder 115 is no less than 50 percent of the dimension of the cross-sectional width dimension of die 117 as depicted in FIG. 1.

There are many methods to adhere protective glass 133 components to dies 117. U.S. 2004/007324 and WO 2009/1063058 disclose common adhesion methods, both of which are hereby incorporated herein by reference in their entireties. It should be appreciated that the above-mentioned documents are non-limiting examples of the types of methods that may be employed to adhere elements glass 133 and die 117. Other known or yet-to-be-developed mechanisms are also considered to be within the scope of the present disclosure.

As can be appreciated, any combination of known or described methods for connecting, affixing, adhering or positioning a stack of components glass 133, adhesive 130, die 117, soft solder 115, frame 105 and/or thermal pad 140 may be used to achieve a solar cell module device 100.

An embodiment of a method of manufacture of a solar cell module device in accordance with at least some embodiments of the present disclosure is depicted in FIGS. 3-5. FIGS. 3 and 4 are pictorial-representations and FIG. 5 is a flow diagram of the process. FIGS. 3-5 will be discussed in combination.

A general order for the steps of the method 300, 500 of a method of manufacture is shown in FIGS. 3 and 5, respectively. The method 500 starts with a start operation 501 and ends with an end operation 560. The method 300, 500 can include more or fewer steps or can arrange the order of the steps differently than those shown in FIGS. 3 and 5, respectively.

Hereinafter, the method 300, 500 shall be explained with reference to the systems, components, elements, etc. described in conjunction with FIGS. 1-2. The method 300, 500 produces an embodiment of the solar cell module 100 of the type shown in FIGS. 1-2.

A frame strip 306, comprising a plurality of copper lead-frames 105 (which will ultimately form a plurality of devices 100), is presented at step 301 of FIG. 3, corresponding to the start operation 501 of FIG. 5. At step 310, 510 soft solder 115 is dispensed onto the plurality of lead-frames 105 for attachment of diode component 110. A diode component 110 is attached, using soft solder 115, to frame strip 306 for each of the copper-lead frames which correspond to each of the plurality of devices 100. The soft solder 115 may be dispensed in several ways, to include melting of soft solder wire onto the frame strip 306 and dispensing soft solder paste directly onto the frame strip 306 substrate. However, in any method 300, 500 the step 310, 510 allows dispensing of soft solder 115 to the frame strip 306 and attachment of the diode component 110 without a reflow process for the diode attachment. That is, step 310, 510 does not require reflow and/or thermal treatment, such as placement into an oven, to enable the attachment.

FIG. 4A depicts a more detailed top-view of a frame strip 306, as presented at step 301 and required for the start operation 501. The frame strip 306 of FIG. 4A comprises four lead-frames 105 (which will ultimately form four devices 100). FIG. 4B is a perspective top-view of one of the four lead-frames 105 of frame strip 306, detailing the connect pins 107 and plating areas 106. The plating areas 106 receive soft solder 115 so as to attach diode component 110 in step 310, 510. FIG. 4C is a perspective bottom-view of one of the four lead-frames 105 of frame strip 306, detailing the thermal pad 140. The thermal pad is exposed after transfer molding step 345, 545 to be described below.

In step 315, 515 soft solder 115 is dispensed onto the plurality of lead-frames 105 for attachment of die 117. A die component 117 is attached, using soft solder 115, to frame strip 306 for each of the copper-lead frames which correspond to a plurality of devices 100. The soft solder 115 may be dispensed in several ways, to include melting of soft solder wire onto the frame strip 306 and dispensing soft solder paste directly onto the frame strip 306 substrate. However, in any method 300, 500 the step 315, 515 allows dispensing of soft solder 115 to the frame strip 306 and attachment of the die component 117 without a flux and/or no-flow under-fill process for die attachment. That is, step 315, 515 does not require additional process steps to attach the die 117 to the frame strip 306 once the soft solder is dispensed onto the frame strip 306, to include not requiring thermal treatment, such as placement into an oven, to enable the attachment. For the purpose of providing additional disclosure regarding die attachment in the prior art, the entire contents of U.S. Pat. No. 5,904,504 are hereby incorporated herein by reference.

In step 320, 520 wire bonding is performed. More specifically, gold wires 120 are bonded between die 117 and lead-frame 105 at plating areas 106. In step 525, adhesive 130 is dispensed which will be used to attach glass 133 to die 117. Adhesive 130 may be UV glue, or other adhesives know to those skilled in the art for attaching glass 133 to die 117. In step 330, 530 glass 133 is attached, via adhesive 130, to die 117. At step 535, adhesive 130, such as UV glue, is allowed to cure.

In step 540, plasma cleaning is performed, a process which may clean component surfaces such as the lead-frame 105. Plasma cleaning is employed to remove, for example, oxides, and/or to assist in the adhesion of the mold 145 to the frame 105.

In step 345, 545 transfer molding occurs, in which mold 145 is positioned and attached to frame strip 306 at each lead-frame 105. The mold 145 may be attached to frame strip 306 by any process known to those skilled in the art, to include by pressure and/or heat. The mold 145 may comprise a thermoset material.

At step 330, 350 a set of four solar cell module devices 100 are trimmed and formed from those formed on the frame strip 306. Generally, trimming comprises removing a particular module device 100 from the frame strip 306 and forming comprises bending the frame 105 so as to form the step configuration of FIGS. 2A-B and also form connector pins 107.

At step 555, each of the now-assembled solar module array devices 100 are tested, for example to evaluate quality and functional capabilities. The method 300, 500 ends at step 560. The process ends at step 560 in producing one or more solar module array devices 100.

U.S. Pat. No. 7,872,686 provides additional detail regarding some of the above steps, such as plasma cleaning, as is incorporated by reference in its entirety.

An alternate embodiment of a method of manufacture of a solar cell module device in accordance with at least some embodiments of the present disclosure is depicted in FIG. 6. FIG. 6 is a flow diagram of the process.

A general order for the steps of the method 600 of a method of manufacture is shown in FIG. 6. The method 600 starts with a start operation 601 and ends with an end operation 660. The method 600 can include more or fewer steps or can arrange the order of the steps differently than those shown in FIG. 6.

Hereinafter, the method 600 shall be explained with reference to the systems, components, elements, etc. described in conjunction with FIGS. 1-2. The method 600 produces an embodiment of the solar cell module 100 of the type shown in FIGS. 1-2.

A frame strip 306, comprising a plurality of copper lead-frames 105 (which will ultimately form a plurality of devices 100), is presented at step 601 of FIG. 6, corresponding to the start operation 601. At step 610 soft solder 115 is dispensed onto the plurality of lead-frames 105 for attachment of diode component 110. A diode component 110 is attached, using soft solder 115, to frame strip 306 for each of the copper-lead frames which correspond to each of the plurality of devices 100. The soft solder 115 may be dispensed in several ways, to include melting of soft solder wire onto the frame strip 306 and dispensing soft solder paste directly onto the frame strip 306 substrate. However, in any method 600 the step 610 allows dispensing of soft solder 115 to the frame strip 306 and attachment of the diode component 110 without a reflow process for the diode attachment. That is, step 610 does not require reflow and/or thermal treatment, such as placement into an oven, to enable the attachment.

Step 612 comprises several steps, all of which are performed at the wafer-level in that they are performed with respect to an individual die 117 (although multiple dies may be engaged at one time). More specifically, step 612 comprises steps 625, 630, 635 and 638. In step 625, adhesive 130 is dispensed which will be used to attach glass 133 to die 117. Adhesive 130 may be UV glue, or other adhesives know to those skilled in the art for attaching glass 133 to die 117. In step 630, glass 133 is attached, via adhesive 130, to die 117. At step 635, adhesive 130, such as UV glue, is allowed to cure. At step 638, individual dies 117 are separated, that is, a wafer saw process is performed to separate individual dies 117 with attached glass 133. At the end of step 638, an individual die 117, with its protective glass 133 adhered, is produced.

Steps 615, 620 and 640-660 of method 600 are the same as steps 515, 520 and 540-560, respectively, of method 500.

At step 615, soft solder 115 is dispensed onto the plurality of lead-frames 105 for attachment of the dies 117 configured with glass (as produced after step 638). A die component 117 with adhered glass 133 is attached, using soft solder 115, to frame strip 306 for each of the copper-lead frames which correspond to each of the plurality of devices 100. The soft solder 115 may be dispensed in several ways, to include melting of soft solder wire onto the frame strip 306 and dispensing soft solder paste directly onto the frame strip 306 substrate. However, in any method 600 the step 615 allows dispensing of soft solder 115 to the frame strip 306 and attachment of the die component 117 (with adhered glass 133) without a flux and/or no-flow under-fill process for die attachment. That is, step 615 does not require additional process steps to attach the die 117 (with adhered glass 133) to the frame strip 306 once the soft solder is dispensed onto the frame strip 306, to include not requiring thermal treatment, such as placement into an oven, to enable the attachment.

In step 620 wire bonding is performed. More specifically, gold wires 120 are bonded between die 117 (with adhered glass 133) and lead-frame 105 at plating areas 106. In step 640, plasma cleaning is performed, a process which may clean component surfaces such as the lead-frame 105. Plasma cleaning is employed to remove, for example, oxides, and/or to assist in the adhesion of the mold 145 to the frame 105.

In step 645 transfer molding occurs, in which mold 145 is positioned and attached to frame strip 306 at each lead-frame 105. The mold 145 may be attached to frame strip 306 by any process known to those skilled in the art, to include by pressure and/or heat. The mold 145 may comprise a thermoset material.

At step 650 a set of four solar cell module devices 100 are trimmed and formed from those formed on the frame strip 306. Generally, trimming comprises removing a particular module device 100 from the frame strip 306 and forming comprises bending the frame 105 so as to form the step configuration of FIGS. 2A-B and also form connector pins 107.

At step 655, each of the now-assembled solar module array devices 100 are tested, for example to evaluate quality and functional capabilities. The method 600 ends at step 660. The process ends at step 660 in producing one or more solar module array devices 100.

To provide additional disclosure regarding the aforementioned components and method of manufacture, the following are incorporated by reference in their entireties: US 2002/0153038; US 2007/0204900; US 2009/0159128; US 2009/0140406; US 2011/0089519; U.S. Pat. No. 6,574,858; U.S. Pat. No. 6,395,972 and U.S. Pat. No. 7,842,542.

While the pictorial representations and flowcharts have been discussed and illustrated in relation to a particular sequence of events, it should be appreciated that changes, additions, and omissions to this sequence can occur without materially affecting the operation of the disclosed embodiments, configuration, and aspects.

The present disclosure, in various aspects, embodiments, and/or configurations, includes components, methods, processes, systems and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and/or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A solar cell module device, comprising:
   a substrate frame comprising a lower portion having an upper surface and a lower surface, a left vertical portion, a right vertical portion, and one or more connector pins, wherein the frame forms a channel defined by the upper surface of the lower portion, an inner surface of the left vertical portion, and an inner surface of the right vertical portion;
   a semiconductor die positioned on the upper surface of the lower portion of the substrate frame, the semiconductor die having an upper surface and a lower surface;
   a solder material disposed between and adhering the upper surface of the lower portion of the substrate frame and the lower surface of the semiconductor die;
   a protective layer of material disposed on the semiconductor die upper surface, the protective layer having an upper surface and a lower surface;
   an electrical component mounted to the upper surface of the lower portion of the substrate frame adjacent to the semiconductor die;
   a mold structure disposed completely within the channel and surrounding the semiconductor die and configured with a recess formed above the upper surface of the protective layer, the mold structure in contact with each of the left vertical portion and the right vertical portion of the substrate frame; and
   one or more electrical connections between the upper surface of the lower portion of the substrate frame and the semiconductor die;
   wherein the one or more connector pins extend from at least one of an upper edge of the left vertical portion and an upper edge of the right vertical portion and terminate parallel to the lower portion of the substrate frame.

2. The device of claim 1, wherein the electrical component is a diode.

3. The device of claim 1, further comprising an adhesive connecting the upper surface of the semiconductor die and the lower surface of the protective layer.

4. The device of claim 1, wherein the substrate frame is a lead frame.

5. The device of claim 4, wherein the electrical component is a diode.

6. The device of claim 1, wherein the protective layer is glass.

7. The device of claim 1, further comprising a thermal pad disposed below the semiconductor die.

8. A solar cell device comprising:
   a frame comprising a horizontal lower portion having an upper surface and a lower surface, a left vertical portion, a right vertical portion and at least one connector pin, wherein the frame forms a channel defined by the upper surface, the left vertical portion and the right vertical portion;
   a semiconductor die positioned on the upper surface of the horizontal lower portion of the frame, the semiconductor die having an upper surface and a lower surface;
   a solder material disposed between and adhering the upper surface of the horizontal lower portion of frame and the lower surface of the semiconductor die;
   a protective layer of material disposed on the semiconductor die upper surface, the protective layer having an upper surface and a lower surface;
   a mold structure disposed completely within the channel and surrounding the semiconductor die, the mold structure configured with a recess formed above the upper surface of the protective layer and fitted to the channel;
   an electrical component mounted to the upper surface of the lower portion of the frame adjacent to the semiconductor die; and
   one or more electrical connections between the upper surface of the lower portion of the frame and the semiconductor die;
   wherein the at least one connector pin extends from at least one of an upper edge of the left vertical portion and an upper edge of the right vertical portion and terminates parallel to the lower portion of the substrate frame.

9. The device of claim 8, wherein the substrate frame is a lead frame.

10. The device of claim 9, further comprising a thermal pad disposed below the semiconductor die.

* * * * *